United States Patent
Edmonds et al.

(10) Patent No.: US 9,305,780 B2
(45) Date of Patent: Apr. 5, 2016

(54) SELF-LIMITING CHEMICAL VAPOR DEPOSITION AND ATOMIC LAYER DEPOSITION METHODS

(71) Applicants: Applied Materials, Inc., Santa Clara, CA (US); The Regents of the University of California, Oakland, CA (US)

(72) Inventors: Mary Edmonds, San Diego, CA (US); Andrew C. Kummel, San Diego, CA (US); Atif M. Noori, Saratoga, CA (US)

(73) Assignees: APPLIED MATERIALS, INC., Santa Clara, CA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/561,525

(22) Filed: Dec. 5, 2014

(65) Prior Publication Data
US 2015/0162182 A1    Jun. 11, 2015

Related U.S. Application Data

(60) Provisional application No. 61/912,930, filed on Dec. 6, 2013.

(51) Int. Cl.
*H01L 21/02*    (2006.01)
*C23C 16/24*    (2006.01)
*C23C 16/455*   (2006.01)

(52) U.S. Cl.
CPC ............ *H01L 21/0262* (2013.01); *C23C 16/24* (2013.01); *C23C 16/45523* (2013.01); *H01L 21/02381* (2013.01); *H01L 21/02387* (2013.01); *H01L 21/02532* (2013.01)

(58) Field of Classification Search
CPC ....... H01L 23/481; H01L 24/81; H01L 24/13; H01L 24/17; H01L 24/03; H01L 21/768
See application file for complete search history.

(56) References Cited

U.S. PATENT DOCUMENTS

2011/0262642 A1* 10/2011 Xiao ................. C07F 7/025
427/255.394

OTHER PUBLICATIONS

B. Shin, et al., Pre-atomic Layer Deposition Surface Cleaning and Chemical Passivation of (100) In 0.2 Ga 0.8 As and Deposition of Ultrathin Al 2 O 3 Gate Insulators, Appl. Phys. Lett., 93, 052911 (2008).

(Continued)

*Primary Examiner* — Roy Potter
(74) *Attorney, Agent, or Firm* — Patterson & Sheridan, LLP

(57) ABSTRACT

Methods for depositing silicon on a semiconductor or metallic surface include cycling dosing of silane and chlorosilane precursors at a temperature between 50° C. and 300° C., and continuing cycling between three and twenty three cycles until the deposition self-limits via termination of surface sites with Si—H groups. Methods of layer formation include depositing a chlorosilane onto a substrate to form a first layer, wherein the substrate is selected from the group consisting of $In_xGa_{1-x}As$, $In_xGa_{1-x}Sb$, $In_xGa_{1-x}N$, SiGe, and Ge, wherein X is between 0.1 and 0.99. The methods may include pulsing a silane to form a silicon monolayer and cycling dosing of the chlorosilane and the silane. Layered compositions include a first layer selected from the group consisting of $In_xGa_{1-x}As$, $In_xGa_{1-x}Sb$, $In_xGa_{1-x}N$, SiGe, and Ge, wherein X is between 0.1 and 0.99, and a second layer, wherein the second layer comprises Si—H and Si—OH.

12 Claims, 2 Drawing Sheets

(56) References Cited

OTHER PUBLICATIONS

S. Yokoyama, et al., Self-Limiting Atomic-Layer Deposition of Si on SiO2 by Alternate Supply of Si2H6 and SiCl4, Appl. Phys. Lett., 79 (5), (2001).

D. Koleske, et al., Atomic Layer Epitaxy of Si on Ge(100) Using Si2Cl6 and Atomic Hydrogen, Appl. Phys. Lett., 64(7), (1994).

E. Hasunuma, et al., Gas-phase-reaction-controlled Atomic-layer-epitaxy of Silicon, J. Vac. Sci. Technol. A, 16(2), (1998).

J. Lee, et al., Kinetics of H 2 ( D 2 ) Desorption from a Ge (100)-2×1: H (D) Surface Studied Using Scanning Tunneling Microscopy and Temperature Programmed Desorption, J. Chem. Phys., 118, 1929, (2003).

P. Gupta, et al., Hydrogen Desoprtion Kinetics from Monohydride and Dihydride Species on Silicon Surfaces, Phys. Rev. B, 37, 8234, (1988).

M. Akazawa, et al., High-k Al2O3 MOS Structures with Si Interface Control Layer Formed on Air-exposed GaAs and InGaAs Wafers, Appl. Surf. Sci., 256, 5708, (2010).

M. El Kazzi, et al., Sub-nm Equivalent Oxide Thickness on Si-passivated GaAs Capacitors with Low Dit , Appl. Phys. Lett, 99, 052102, (2011).

M. Akazawa, et al., Control of GaAs and InGaAs Insulator-Semiconductor and Metal-Semiconductor Interfaces by Ultrathin Molecular Beam Epitaxy Si Layers, Jpn. J. Appl. Phys., 30, 3744, (1991).

\* cited by examiner

US 9,305,780 B2

SELF-LIMITING CHEMICAL VAPOR DEPOSITION AND ATOMIC LAYER DEPOSITION METHODS

CROSS-REFERENCE TO RELATED APPLICATIONS

This application claims benefit of U.S. Provisional Patent Application Ser. No. 61/912,930, filed Dec. 6, 2013, which is herein incorporated by reference in its entirety.

FIELD

Embodiments of the present disclosure generally relate to deposition of materials. Another field of the present disclosure is semi-conductor device fabrication technology. Particular applications of the present disclosure include the formation of silicon layers.

BACKGROUND

A sub 400° C. ALD process for growing monolayers of Si on clean surfaces by alternating pulses of $Si_2H_6$ and $SiCl_4$ employed with the substrate temperature varied between 355°-385° C. The process is slow, with each ALD cycle taking several minutes and the desorption of the HCl(g) biproduct being slow below 400° C. Other processes include monolayer silicon ALD growth on Ge with use of alternating pulses of $Si_2Cl_6$ and atomic hydrogen, or $Si_2Cl_6$ and $Si_2H_6$, at undesirably high substrate temperatures of 400°-465° C.

Physical vapor deposition (PVD) of silicon for passivation of III-V surfaces has been reported, but requires a silicon multilayer as the silicon is not ordered. Also, the PVD deposition of silicon is not compatible with processing of three dimensional devices such as finFETs on large semiconductor wafers.

SUMMARY

In one embodiment, a method for depositing silicon on a semiconductor or metallic surface comprises cycling dosing of silane and chlorosilane precursors at a temperature between 50° C. and 300° C. and continuing cycling between three and twenty three cycles until the deposition self-limits via termination of surface sites with Si—H groups.

In another embodiment, a method of layer formation comprises depositing a chlorosilane onto a substrate to form a first layer, wherein the substrate is selected from the group consisting of $In_xGa_{1-x}As$, $In_xGa_{1-x}Sb$, $In_xGa_{1-x}N$, SiGe, and Ge, wherein X is between 0.1 and 0.99. The method may include pulsing a silane to form a silicon monolayer. The method may include cycling dosing of the chlorosilane and the silane.

In another embodiment, a layered composition comprises a first layer selected from the group consisting of $In_xGa_{1-x}As$, $In_xGa_{1-x}Sb$, $In_xGa_{1-x}N$, SiGe, and Ge, wherein X is between 0.1 and 0.99, and a second layer, wherein the second layer comprises Si—H and Si—OH.

DETAILED DESCRIPTION

Figure 1:
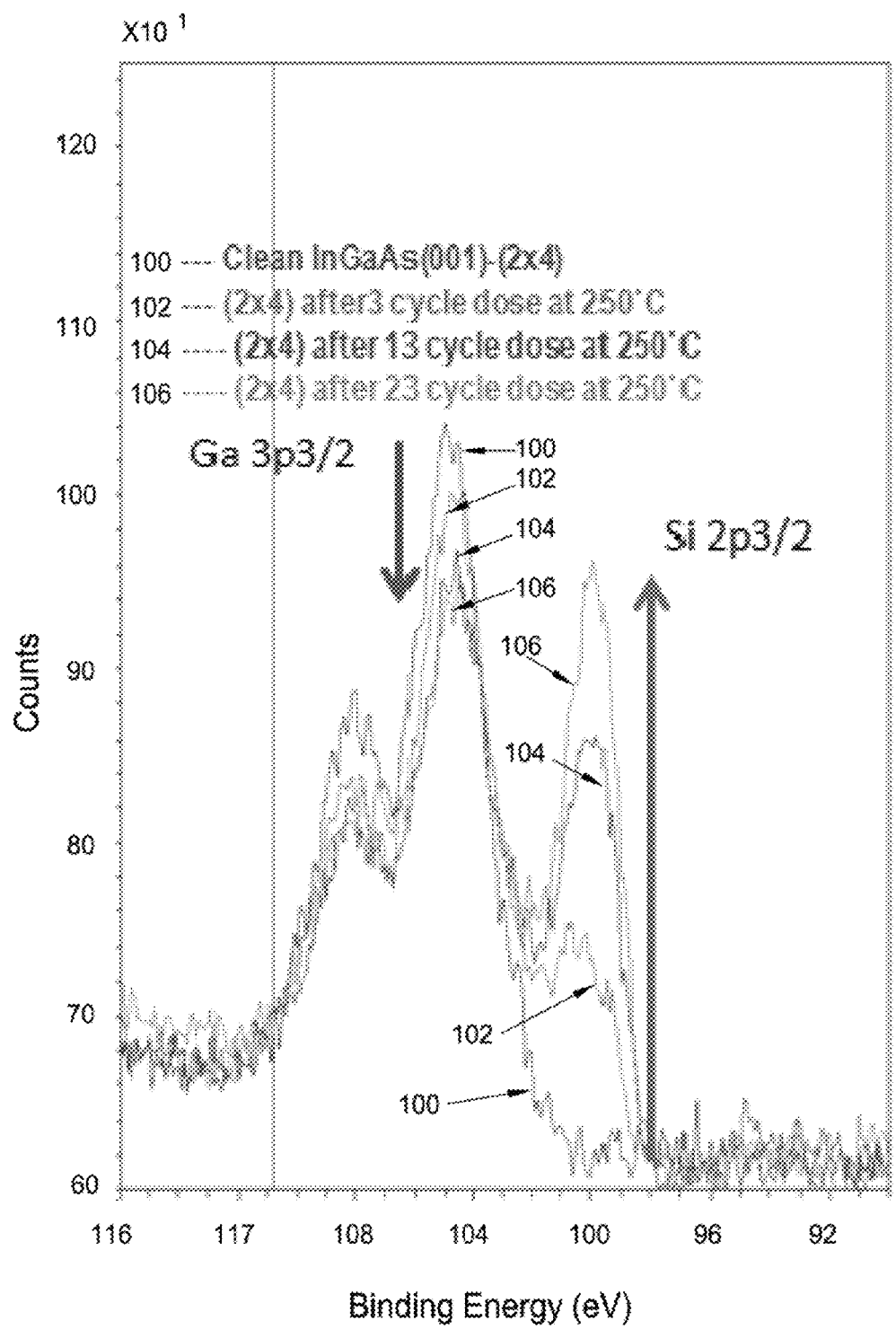
FIG. 1 is overlaid XPS spectra illustrating the increase of the silicon 2p3/2 peak and the decrease in the gallium 3p3/2 peak according to some embodiments of the present disclosure.

In one embodiment, a method for depositing silicon on a semiconductor or metallic surface comprises cycling dosing of silane and chlorosilane precursors at a temperature between 50° C. and 300° C. and continuing cycling between three and twenty three cycles until the deposition self-limits via termination of surface sites with Si—H groups.

In another embodiment, a method of layer formation comprises depositing a chlorosilane onto a substrate to form a first layer, wherein the substrate is selected from the group consisting of $In_xGa_{1-x}As$, $In_xGa_{1-x}Sb$, $In_xGa_{1-x}N$, SiGe, and Ge, wherein X is between 0.1 and 0.99. The method may include pulsing a silane to form a silicon monolayer. The method may include cycling dosing of the chlorosilane and the silane.

In another embodiment, a layered composition comprises a first layer selected from the group consisting of $In_xGa_{1-x}As$, $InGa_{1-x}Sb$, $In_xG_{1-x}N$, SiGe, and Ge, wherein X is between 0.1 and 0.99, and a second layer, wherein the second layer comprises Si—H and Si—OH.

Embodiments of the present disclosure may provide self-limiting and saturating atomic layer deposition (ALD) and self-limiting and saturating chemical vapor deposition (CVD) of a silicon seed layer on a variety of non-silicon layer surfaces. Embodiments of the present disclosure may include depositing a silicon seed layer on substrates of varying ahoy compositions (e.g. indium gallium arsenide, indium gallium antiminide, indium gallium nitride, and silicon-germanium), as well as germanium and metallic substrates.

Embodiments of the present disclosure provide low temperature silicon ALD and can use different substrates. Embodiments provide a comparable drop in substrate temperature to 250° C. or less in addition to providing self-limiting and saturating ALD growth.

Artisans have failed, to the knowledge of the present inventors, to provide self-limiting and saturating silicon CVD on non-silicon surfaces despite studies and reports in the literature of temperature ranges at which hydrogen desorption occurs from similar applicable substrates of Si, Ge, and GaAs. The silane precursor self-limiting CVD process produces saturation when all surface sites are terminated by Si—H groups. Thus, desorption of $H_2(g)$ from substrate surface sites may occur until all surface sites become terminated by Si—H. Increase of substrate temperature to 400° C. leads to continued ALD silicon growth on top of the self-limiting ALD silicon seed layer or on top of the saturated self-limited CVD silicon seed layer.

For oxide deposition, metal contact deposition, surface functionalization, surface passivation, and oxide nucleation, methods of the present disclosure provide advantages compared to typical current semiconductor and metal substrate surface preparation and controlled growth methods.

Methods of the present disclosure may provide for improved semiconductor and metal substrate surface preparation and controlled growth methods. Functionalization creates a surface that is reactive to ALD precursors. Passivation forms a monolayer that leaves the Fermi level unpinned. The monolayer nucleation is the initial layer of ALD deposition. The process is low temperature. In one embodiment, preparation, functionalization, passivation and ALD deposition is performed at 250° C. Certain surfaces and substrates will permit lower temperatures. Substrates that recombinatively desorb $H_2$ at lower temperatures, e.g., 150° C., permit use of lower temperatures. Examples include InGaAs and InAs.

Present silicon saturating and self-limiting ALD and CVD processes of the present disclosure achieve functionalization, passivation and monolayer nucleation at 250° C. (and lower for some substrates), which is much lower temperature, on both metallic and semiconductor substrates, than comparable silicon ALD procedures reported in literature. The self-limiting and saturating silicon CVD process at 250° C. is advantageous from a device fabrication standpoint compared to existing silicon ALD processes that are at significantly higher temperature (above 350° C.) and provide for continuous growth of silicon on silicon and is not self-limiting. A unique strong bonding of silicon to all crystal faces of $In_xGa_{1-x}As$, $In_xGa_{1-x}Sb$, $In_xGa_{1-x}N$, SiGe, and Ge should enable transfer of the dangling bonds from the substrate to silicon, and silicon is readily hydrogen passivated even by molecular $H_2$ due to the uniquely strong Si—H bonds. The monolayer of —OH may be ideal for nucleating almost any metal ALD precursor.

The ability to passivate metallic surfaces provides additional applications beyond semiconductor device fabrication. For example, methods of the present disclosure can provide a surface protection against oxidation on metallic surfaces.

The present disclosure provides, for example, self-limiting and saturating atomic layer deposition (ALD) and self-limiting and saturating chemical vapor deposition (CVD) of a silicon seed layer on indium gallium arsenide (InGaAs), indium gallium antiminide (InGaSb), indium gallium nitride (InGaN), and silicon-germanium (SiGe) substrates of varying alloy compositions, as well as germanium and metallic substrates. Embodiments of the present disclosure also provide a procedure for ALD silicon on top of the self-limiting ALD silicon seed layer or on top of the saturated self-limited CVD silicon seed layer for continued growth of silicon.

A silicon monolayer deposited as described herein can serve several purposes. (1) The dangling bonds of the substrate will be transferred to silicon, which are then passivated by hydrogen, leaving the surface electrically passivated. (2) The saturated monolayer of silicon with H passivation will serve to protect the semiconductor or metallic substrate from oxidation. (3) The silicon monolayer with possible H termination (e.g. Si—H) can also be employed for deposition of gate oxide through functionalization by an oxidant such as HOOH(g), in order to create an Si—OH layer which would react with nearly any ALD precursor thereby eliminating the need for metal precursor nucleation (for example with trimethyl aluminum predosing) decreasing EOT and lowering border trap density and fixed charge associated with interfacial layers or even direct bonding of oxide to nonsilicon semiconductors. The same procedure can be used for other crystallographic faces such as $In_xGa_{1-x}As(110)$, $In_xGa_{1-x}Sb(110)$, $In_xGa_{1-x}N(110)$, SiGe(110), and Ge(110). Some ALD precursors such as those containing O or OH groups may directly react with the Si—H termination. (4) The silicon monolayer or silicon monolayer with additional oxide ALD can be employed for metal contact formation.

Experiments of the present disclosure will be understood by artisans in view of the general knowledge in the art and the description that follows to illustrate broader features of some embodiments of the present disclosure.

The experiments showed self-limiting ALD of silicon on semiconductor and metal surface. Dosing parameters for near saturation coverage of silicon on dean InGaAs surface through cyclic dosing of $Si_2Cl_6$ and $Si_3H_8$ were shown. Scanning Tunneling Microscopy (STM) and X-Ray Photoelectron Spectroscopy (XPS) measurements were performed to investigate surface bonding configurations and electronic structures of Si/InGaAs(001)-(2×4). Thermal annealing measurements were also performed during this time to demonstrate thermal stability of the surface.

The experiments also show self-limiting CVD of silicon on semiconductor and metal surfaces through dosing of $Si_3H_8$. Dosing parameters were determined for near saturation coverage of silicon on clean InGaAs surface. STM and XPS measurements were used to investigate surface bonding configurations and electronic structures of silicon/InGaAs(001)-(2×4). Thermal annealing measurements were also performed during this time to demonstrate thermal stability of the surface.

One embodiment includes a self-limiting atomic layer deposition procedure based upon the saturation of the substrate semiconductor or metallic surface sites through a surface termination with Si—H and Si—Cl groups by cyclic dosing of silane and chlorosilane precursors at 250° C. Silane precursors include: $SiH_4$, $Si_2H_6$, $Si_3H_8$, $S_4H_{10}$, $Si_5H_{12}$ and chlorosilane precursors include: $SiCl_4$, $Si_2Cl_6$, $Si_3Cl_8$. Once all surface sites are terminated with Si—H and Si—Cl groups, the reaction becomes self-terminating, as hydrogen and chlorine bond to silicon stronger than other semiconductor or metallic materials. The self-limiting and saturating chemical vapor deposition procedure is based upon the saturation of the substrate semiconductor or metallic surface sites through a surface termination with Si—H groups by dosing a silane precursor at 250° C. Once surface sites are terminated with Si—H groups, the reaction becomes self-terminating, as hydrogen bonds to silicon stronger than other semiconductor or metallic materials. Further silicon growth can occur on either the self-limiting atomic layer deposition or chemical vapor deposition saturated surfaces by raising the temperature to 400° C. The $H_2(g)$ and HCl(g) desorption product occurs only slowly below this temperature at the point of surface saturation.

The self-limiting atomic layer deposition procedure in an experiment is discussed next. A decapped $In_{0.53}Ga_{0.47}As$ (001)-(2×4) surface was dosed with 1 MegaLangmuir of $Si_7Cl_6$ followed by 1 MegaLangmuir of $Si_3H_8$ at a sample temperature of 250° C. This procedure constitutes one complete self-limiting and saturating ALD cycle. After three cycles, an X-ray photoelectron spectroscopy (XPS) spectrum is taken of the surface with a non-monochromatic aluminum channel X-ray flood source system at a glancing angle of 30° to produce surface sensitive spectra. The XPS spectra were also recorded following 13 and 23 total self-limiting and saturating ALD cycles. FIG. 1 shows the increase of the silicon 2p3/2 peak at 100 eV and the decrease in the gallium 3p3/2 peak at 105 eV, as indicated by the arrows for all three spectra as well as the spectra of the clean decapped surface for comparison.

As shown in FIG. 1: Non-monochromatic aluminum channel X-ray flood source system spectra for clean decapped $In_{0.53}Ga_{0.47}As(001)$-(2×4) surface (100), $In_{0.53}Ga_{0.47}As$ (001)-(2×4) surface following 3 ALD cycles at 250° C. (102), $In_{0.53}Ga_{0.47}As(001)$-(2×4) surface following 13 ALD cycles at 250° C. (104), and $In_{0.53}Ga_{0.47}As(001)$-(2×4) surface following 23 ALD cycles 250° C. (106). The spectra are shown of the Ga 3p3/2 and Si 2p3/2 peaks. As shown in Table 1 and FIG. 1 (by, for example, the Ga 3p3/2 peak at 105 eV of 100, 102, 104 and 106) near saturation of silicon on $In_{0.53}Ga_{0.47}As$ (001)-(2×4) surface is reached after 13 self-limiting ALD cycles at 250° C. Full saturation may involve about 50 pulses or a different operating temperature; since the kinetics are likely desorption limited there are a variety of puke times, desorption/purge times, and processing temperature which will suffice.

The raw counts corrected by Schofield photoionization cross sectional relative sensitivity factors are recorded for doublet peak pairs of As 2p, Ga 2p, In 3d, Si 2p, Cl 2p for the clean decapped $In_{0.53}Ga_{0.47}As(001)$-(2×4) surface (100) as well as the 3, 13, and 23 ALD cycle dosed surfaces at sample temperature 250° C. (102, 104 and 106, respectively) and are shown in Table 1.

TABLE 1

Non-monochromatic aluminum channel X-ray flood source system raw counts corrected by Schofield photoionization cross sectional relative sensitivity factors for clean decapped $In_{0.53}Ga_{0.47}As(001)$-(2 × 4) surface (100), $In_{0.53}Ga_{0.47}As(001)$-(2 × 4) surface following 3 ALD cycles at 250° C. (102), $In_{0.53}Ga_{0.47}As(001)$-(2 × 4) surface following 13 ALD cycles at 250° C. (104), and $In_{0.53}Ga_{0.47}As(001)$-(2 × 4) surface following 23 ALD cycles 250° C. (106).

| Surface | As 2p | Ga 2p | In 3d | Si 2p | Cl 2p |
|---|---|---|---|---|---|
| Clean decapped $In_{0.53}Ga_{0.47}As(001)$-(2 × 4) surface (100) | 184.8 | 155.2 | 689.9 | 0.0 | 0.0 |
| 3 ALD cycles at 250° C. (102) | 158.2 | 112.4 | 483.5 | 509.9 | 581.3 |
| 13 ALD cycles at 250° C. (104) | 115.6 | 72.2 | 242.4 | 665.6 | 576.3 |
| 23 ALD cycles at 250° C. (106) | 90.5 | 57.6 | 351.3 | 714.7 | 544.2 |

The raw counts corrected by Schofield photoionzation cross sectional relative sensitivity factors are recorded and listed in Table 2 as relative atomic ratios compared to the total As 3d peak. AH peaks ratios tabulated in Table 2 are from comparable low binding energies, including: Ga 3d, In 3d, Si 2p, Cl 2p, and Ta 4d total peak values for both doublet peak pairs, as well as the O 1s, C 1s peaks. Ratios are listed for the clean decapped $In_{0.53}Ga_{0.47}As(001)$-(2×4) surface (100) as well as the 3, 13, and 23 ALD cycle dosed surfaces at sample temperature 250° C. (102, 104 and 106, respectively). As shown in Table 2 and FIG. 1 (by, for example, the Ga 3p3/2 peak at 105 eV of 100, 102, 104 and 106) near saturation of silicon on $In_{0.53}Ga_{0.47}As(001)$-(2×4) surface is reached after 13 self-limiting ALD cycles at 250° C. Full saturation may involve about 50 pulses or a different operating temperature; since the kinetics are likely desorption limited there are a variety of pulse times, desorption/purge times, and processing temperature which will suffice.

The filled-state STM image may be obtained of $In_{0.53}Ga_{0.47}As(001)$-(2×4) surface following 23 self-limiting and saturating ALD cycles of 1 MegaLangmuir of $Si_2Cl_6$ followed by 1 MegaLangmuir of $Si_3H_8$ at a sample temperature of 250° C. as compared to the clean decapped $In_{0.53}Ga_{0.47}As(001)$-(2×4) surface. The dosed surface contains high atomic surface order and the surface should be terminated by Si—H, leaving the surface Fermi level unpinned.

Figure 2:
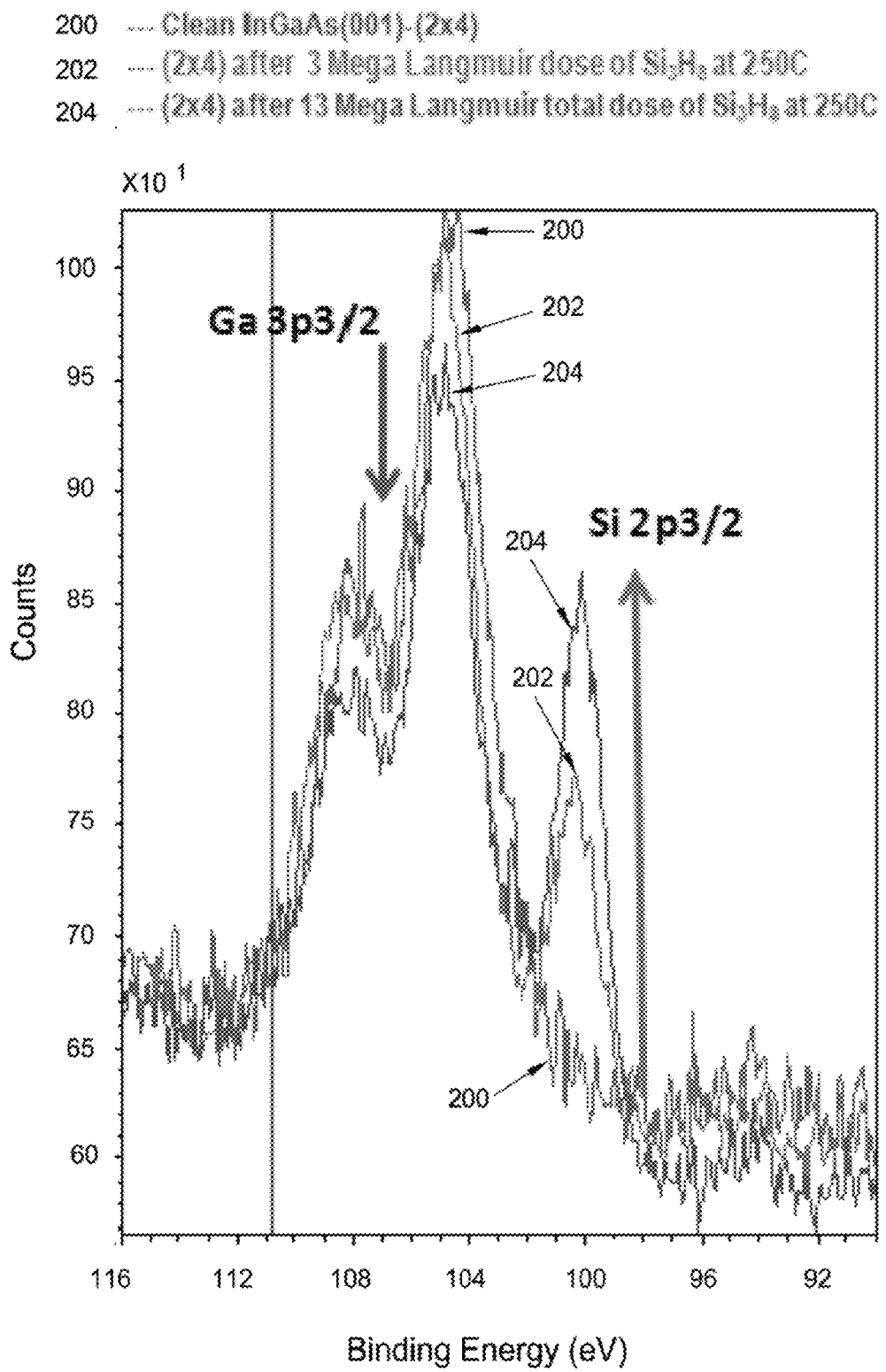
FIG. 2 is overlaid XPS spectra illustrating the increase of the silicon 2p3/2 peak and the decrease in the gallium 3p3/2 peak according to some embodiments of the present disclosure.

The self-limiting and saturating CVD procedure may include a decapped $In_{0.53}Ga_{0.47}As(001)$-(2×4) surface dosed with 1 MegaLangmuir of $Si_3H_8$ at a sample temperature of 250° C. This procedure constitutes one complete self-limiting and saturating CVD cycle. After three cycles, an X-ray photoelectron spectroscopy (XPS) spectrum is taken of the surface with a non-monochromatic aluminum channel X-ray flood source system at a glancing angle of 30' to produce surface sensitive spectra. The XPS spectra were also recorded following 13 total self-limiting and saturating CVD cycles. FIG. 2 shows the increase of the silicon 2p3/2 peak at 100 eV and the decrease in the gallium 3p3/2 peak at 105 eV, as indicated by the arrows for both spectra as well as the spectra of the clean decapped surface for comparison.

As shown in FIG. 2: Non-monochromatic aluminum channel X-ray flood source system spectra for clean decapped $In_{0.53}Ga_{0.47}As(001)$-(2×4) surface (200), $In_{0.53}Ga_{0.47}As(001)$-(2×4) surface following 3 CVD cycles at 250° C. (202), and $In_{0.53}Ga_{0.47}As(001)$-(2×4) surface following 13 CVD cycles at 250° C. (204). The spectra are shown of the Ga 3p3/2 peaks at 105 eV and Si 2p3/2 peaks at 100 eV.

The raw counts corrected by Schofield photoionization cross sectional relative sensitivity factors are recorded for doublet peak pairs of As 2p, Ga 2p, In 3d, Si 2p, Cl 2p for the clean decapped $In_{0.53}Ga_{0.47}As(001)$-(2×4) surface (200) as well as the 3 and 13 CVD cycle dosed surfaces at sample temperature 250° C. (202 and 204, respectively) and are shown in Table 3. The Ga 3p3/2 peak continues to diminish with 13 cycles (204) and near saturation of silicon on $In_{0.53}Ga_{0.47}As(001)$-(2×4) surface is reached after 13 self-limiting and saturating CVD cycles at 250° C. (204). $H_2$ desorption is close to zero at 250° C. on silicon.

TABLE 2

Non-monochromatic aluminum channel X-ray flood source system raw counts corrected by Schofieid photoionization cross sectional relative sensitivity factors and listed as relative atomic ratios compared to the total As 3d peak. All spin orbit split peaks include peak counts from both doublet pair peaks.

| Surface | As 3d | Ga 2p | In 3d | Si 2p | Cl 2p | O 1s | C 1s | Ta 4d |
|---|---|---|---|---|---|---|---|---|
| Clean decapped $In_{0.53}Ga_{0.47}As(001)$-(2 × 4) surface (100) | 1.00 | 0.90 | 0.56 | 0.00 | 0.00 | 0.03 | 0.13 | 0.29 |
| 3 ALD cycles at 250° C. (102) | 1.00 | 0.78 | 0.37 | 0.39 | 0.44 | 0.32 | 0.38 | 0.35 |
| 13 ALD cycles at 250° C. (104) | 1.00 | 0.80 | 0.19 | 0.52 | 0.45 | 0.53 | 0.50 | 0.33 |
| 23 ALD cycles at 250° C. (106) | 1.00 | 0.81 | 0.30 | 0.62 | 0.47 | 0.51 | 0.62 | 0.34 |

Ratio values are listed for clean decapped $In_{0.53}Ga_{0.47}As(001)$-(2 × 4) surface (100), $In_{0.53}Ga_{0.47}As(001)$-(2 × 4) surface following 3 ALD cycles at 250° C. (102), $In_{0.53}Ga_{0.47}As(001)$-(2 × 4) surface following 13 ALD cycles at 250° C. (104), and $In_{0.53}Ga_{0.47}As(001)$-(2 × 4) surface following 23 ALD cycles 250° C. (106).

TABLE 3

Non-monochromatic aluminum channel X-ray flood source system raw counts corrected by Schofield photoionization cross sectional relative sensitivity factors for clean decapped $In_{0.53}Ga_{0.47}As(001)$-$(2 \times 4)$ surface (200), $In_{0.53}Ga_{0.47}As(001)$-$(2 \times 4)$ surface following 3 CVD cycles at 250° C. (202), and $In_{0.53}Ga_{0.47}As(001)$-$(2 \times 4)$ surface following 13 CVD cycles at 250° C. (204).

| Surface | As 2p | Ga 2p | In 3d | Si 2p |
|---|---|---|---|---|
| Clean decapped $In_{0.53}Ga_{0.47}As(001)$-$(2 \times 4)$ surface (200) | 213.80 | 174.90 | 699.40 | 0.00 |
| 3 ALD cycles at 250° C. (202) | 130.10 | 119.40 | 545.40 | 320.10 |
| 13 ALD cycles at 250° C. (204) | 111.50 | 97.10 | 472.40 | 603.10 |

The self-limiting and saturating CVD procedure includes a decapped $In_{0.53}Ga_{0.47}As(001)$-$(2\times4)$ surface dosed with 1 MegaLangmuir of $Si_3H_8$ at a sample temperature of 250° C. This procedure constitutes one complete self-limiting and saturating CVD cycle. After three cycles, an XPS spectrum is taken of the surface with a non-monochromatic aluminum channel X-ray flood source system at a glancing angle of 30° to produce surface sensitive spectra. The XPS spectra were also recorded following 13 total self-limiting and saturating CVD cycles. FIG. 2 shows the increase of the silicon 2p3/2 peak at 100 eV and the decrease in the gallium 3p3/2 peak at 105 eV, as indicated by the arrows for both spectra as well as the spectra of the clean decapped surface for comparison.

The raw counts corrected by Schofield photoionzation cross sectional relative sensitivity factors are recorded and listed in Table 4 as relative atomic ratios compared to the total As 3d peak. All peaks ratios tabulated in Table 4 are from comparable low binding energies, including: Ga 3d, In 3d, Si 2p, Cl 2p, and Ta 4d total peak values for both doublet peak pairs, as well as the O 1s, C 1s peaks. Ratios are listed for the clean decapped $In_{0.53}Ga_{0.47}As(001)$-$(2\times4)$ surface (200) as well as for the 3 and 13 self-limiting and saturating CVD cycle dosed surfaces at sample temperature 250° C. (202 and 204, respectively). As shown in Table 4 and FIG. 2 (by, for example, the Ga 3p3/2 peak at 105 eV of 200, 202, and 204) near saturation of silicon on $In_{0.53}Ga_{0.47}As(001)$-$(2\times4)$ surface is reached after 13 CVD cycles at 250° C. In some embodiments, longer doses of $Si_3H_8$ or 25+ cycles or a different operating temperature may be used; since the kinetics are likely desorption limited there are a variety of pulse times, desorption/purge times, and processing temperature which will suffice.

Many applications will be apparent to artisans from the above discussion. Particular applications include that the CVD or ALD deposited silicon monolayer is applicable for use as a semiconductor and metallic surface protection layer from unwanted oxidation. This application may serve useful during deposition and processing of gate stacks on FinFETs for MOSFETs. Embodiments of the present disclosure may provide surface termination by Si—H groups followed by functionalization with an oxidant, creating an Si—OH layer, which can be performed prior to oxide gate deposition and source drain contact formation. The same process can be used for a monolayer oxide on unpinning of source/drain contacts on MOSFETs which is critical for SiGe. The same process can be used in flash memory where thin high-k oxides are needed for low voltage operation.

While specific embodiments of the present disclosure have been shown and described, it should be understood that other modifications, substitutions and alternatives are apparent to one of ordinary skill in the art. Such modifications, substitutions and alternatives can be made without departing from the spirit and scope of the present disclosure, which should be determined from the appended claims.

Various features of the present disclosure are set forth in the appended claims.

The invention claimed is:

1. A method for depositing silicon on a semiconductor or metallic surface, the method comprising:
   cycling dosing of silane and chlorosilane precursors at a temperature between 50° C. and 300° C.;
   continuing cycling until the deposition self-limits via termination of surface sites with Si—H groups; and
   after self-termination, raising the temperature and depositing additional silicon.

2. The method of claim 1, wherein the low temperature is at or below 250° C. and the surface is the surface of a substrate of one of $In_xGa_{1-x}As$, $In_xGa_{1-x}Sb$, $In_xGa_{1-x}N$, SiGe, Ge and a metallic substrate.

3. The method of claim 1, wherein the low temperature is at or below 150° C. and the surface is the surface of a substrate that recombinatively desorbs $H_2$ at or below 150° C.

4. The method of claim 1, wherein the silane precursor is one of $SiH_4$, $Si_2H_6$, $Si_3H_8$, $Si_4H_{10}$, and $Si_5H_{12}$.

5. The method of claim 1, wherein the chlorosilane precursor is one of $SiCl_4$, $Si_2Cl_6$, and $Si_3Cl_8$.

6. A method of layer formation comprising:
   depositing a chlorosilane onto a substrate to form a first layer, wherein the substrate is selected from the group consisting of $In_xGa_{1-x}As$, $In_xGa_{1-x}Sb$, $In_xGa_{1-x}N$, SiGe, and Ge, wherein X is between 0.1 and 0.99;

TABLE 4

Non-monochromatic aluminum channel X-ray flood source system raw counts corrected by Schofield photoionization cross sectional relative sensitivity factors and listed as relative atomic ratios compare to the total As 3d peak. All spin orbit split peaks include peak counts from both doublet pair peaks.

| Surface | As 3d | Ga 2p | In 3d | Si 2p | Cl 2p | O 1s | C 1s | Ta 4d |
|---|---|---|---|---|---|---|---|---|
| Clean decapped $In_{0.53}Ga_{0.47}As(001)$-$(2 \times 4)$ surface (200) | 1.00 | 0.98 | 0.61 | 0.00 | 0.00 | 0.66 | 0.57 | 0.38 |
| 3 ALD cycles at 250° C. (202) | 1.00 | 1.01 | 0.53 | 0.31 | 0.00 | 0.10 | 0.37 | 0.38 |
| 13 ALD cycles at 250° C. (204) | 1.00 | 0.78 | 0.46 | 0.58 | 0.00 | 0.63 | 0.61 | 0.32 |

Ratio values are listed for clean decapped $In_{0.53}Ga_{0.47}As(001)$-$(2 \times 4)$ surface (200), $In_{0.53}Ga_{0.47}As(001)$-$(2 \times 4)$ surface following 3 self-limiting and saturating CVD cycles at 250° C. (202), and $In_{0.53}Ga_{0.47}As(001)$-$(2 \times 4)$ surface following 13 self-limiting and saturating CVD cycles at 250° C. (204).

pulsing a silane to form a silicon monolayer on the first layer; and cycling dosing of the chlorosilane and the silane.

7. The method of claim 6, further comprising functionalizing the silicon monolayer with an oxidant.

8. The method of claim 6, wherein the cycling dosing of the chlorosilane and the silane is performed within a range of 50° C. to 300° C.

9. A layered composition, comprising:
a first layer selected from the group consisting of $In_xGa_{1-x}As$, $In_xGa_{1-x}Sb$, $In_xGa_{1-x}N$, SiGe, and Ge, wherein X is 0.53; and
a second layer, wherein the second layer comprises Si—H and Si—OH.

10. The method of claim 6, wherein the layer has a surface that recombinatively desorbs $H_2$ at or below 150° C.

11. The method of claim 6, wherein the silane precursor is $SiH_4$, $Si_2H_6$, $Si_3H_8$, $Si_4H_{10}$, or $Si_5H_{12}$.

12. The method of claim 6, wherein the chlorosilane precursor is $SiCl_4$, $Si_2Cl_6$, or $Si_3Cl_8$.

* * * * *